(12) United States Patent
Lasich et al.

(10) Patent No.: US 12,255,579 B2
(45) Date of Patent: Mar. 18, 2025

(54) LOW COST DISPATCHABLE SOLAR POWER

(71) Applicant: RAYGEN RESOURCES PTY LTD, Blackburn (AU)

(72) Inventors: John Beavis Lasich, Blackburn (AU); Richard James Payne, Blackburn (AU); Sean Alexander Baker, Blackburn (AU); Anthony John Kitchener, Blackburn (AU)

(73) Assignee: Raygen Resources Pty Ltd, Blackburn (AU)

( * ) Notice: Subject to any disclaimer, the term of this patent is extended or adjusted under 35 U.S.C. 154(b) by 0 days.

(21) Appl. No.: 17/258,935

(22) PCT Filed: Jul. 11, 2019

(86) PCT No.: PCT/AU2019/050728
§ 371 (c)(1),
(2) Date: Jan. 8, 2021

(87) PCT Pub. No.: WO2020/010401
PCT Pub. Date: Jan. 16, 2020

(65) Prior Publication Data
US 2021/0336582 A1    Oct. 28, 2021

(30) Foreign Application Priority Data
Jul. 11, 2018    (AU) ................................ 2018902511

(51) Int. Cl.
*H02S 40/44*    (2014.01)
*F01K 3/12*    (2006.01)
(Continued)

(52) U.S. Cl.
CPC ............... *H02S 40/44* (2014.12); *F01K 3/12* (2013.01); *F03G 6/001* (2013.01); *F03G 6/005* (2013.01);
(Continued)

(58) Field of Classification Search
CPC .......... F03G 6/001; F03G 6/003; F03G 6/004; F03G 6/005; F03G 6/065; F03G 6/066;
(Continued)

(56) References Cited

U.S. PATENT DOCUMENTS 9,038,390 B1    5/2015    Kreuger
2011/0309635 A1 *    12/2011    Sardo ...................... F01K 25/08
290/1 A
(Continued)

FOREIGN PATENT DOCUMENTS

EP    2602443 A1 *    6/2013
EP    2698506 A1 *    2/2014    ........... F01K 25/103
(Continued)

OTHER PUBLICATIONS

Search Report & Written Opinion issued in Int'l Appl. No. PCT/AU2019/050728 (2019).

*Primary Examiner* — Mark A Laurenzi
*Assistant Examiner* — Xiaoting Hu
(74) *Attorney, Agent, or Firm* — Barnes & Thornburg LLP; G. Peter Nichols

(57) ABSTRACT

A method of operating a solar energy plant and a solar plant are disclosed. Thermal energy produced in the plant is used to heat a first volume of water and charge a hot store in the plant. Electricity produced in the plant operates a heat engine or other device, such as a refrigeration unit, to extract heat and consequently cool a second volume of water and charge a cold store. As desired, energy is transferred from the hot store to a heat engine and energy is transferred from (Continued)

the heat engine to the cold store to operate the heat engine to produce power in the plant.

15 Claims, 8 Drawing Sheets

(51) Int. Cl.
  *F03G 6/00* (2006.01)
  *H02S 40/42* (2014.01)
(52) U.S. Cl.
  CPC .............. *F03G 6/071* (2021.08); *F03G 6/092* (2021.08); *H02S 40/425* (2014.12)
(58) Field of Classification Search
  CPC .......... F03G 6/067; F03G 6/071; F03G 6/092; F25B 6/04; F25B 2400/24; F25B 2400/053; F25B 25/005; F25B 2700/2111; H02S 10/10; H02S 10/20; H02S 10/30; H02S 40/42; H02S 40/425; H02S 40/44; H01L 31/052; H01L 31/0521; H01L 31/0525; H01L 31/053; F01K 17/005; F01K 3/12
  See application file for complete search history.

(56) References Cited

U.S. PATENT DOCUMENTS

| 2013/0087301 | A1* | 4/2013 | Hemrle | F01K 3/12 |
| | | | | 165/4 |
| 2013/0199753 | A1 | 8/2013 | Muren | |
| 2015/0143806 | A1 | 5/2015 | Friesth | |
| 2016/0156309 | A1* | 6/2016 | Almogy | H02S 40/44 |
| | | | | 60/641.15 |
| 2016/0352282 | A1* | 12/2016 | Lasich | F01D 5/02 |
| 2018/0340712 | A1* | 11/2018 | Peter | F28D 20/02 |

FOREIGN PATENT DOCUMENTS

| WO | WO 2009/064378 | 5/2009 |
| WO | WO 2012/009764 | 1/2012 |
| WO | WO 2017/100768 | 6/2017 |
| WO | WO 2018/044452 | 3/2018 |

* cited by examiner

SINGLE STAGE ENGINE/EXPANDER CYCLE TO PRODUCE ELECTRICITY ON DEMAND

MULTISTAGE ENGINE/EXPANDER MODE TO PRODUCE ELECTRICITY ON DEMAND

CHILLER SYSTEM WITH MULTISTAGE RECUPERATION

CONFIGURATION OF SINGLE UNIT AND QUAD CASCADE SYSTEMS

LOW COST DISPATCHABLE SOLAR POWER

This application is a U.S. nationalization under 35 U.S.C. § 371 of International Application No. PCT/AU2019/050728, filed Jul. 11, 2019, which claims priority to Australian Patent Application No. 2018902511, filed Jul. 11, 2018, the entire contents of each are incorporated herein by reference.

FIELD OF THE INVENTION

The present invention relates to producing low cost dispatchable solar power.

In particular, although by no means exclusively, the present invention relates to storing solar energy as other forms of recoverable energy and recovering the energy selectively, for example as electricity, and producing low cost power on demand.

BACKGROUND OF THE INVENTION

The intermittent nature of solar energy is a major barrier to widespread use of solar energy.

There has been considerable research and development work into options for storing solar energy. Options considered include chemical storage batteries, pumped hydro systems, and thermal storage using a heat transfer medium (such as molten salt or hot rocks).

Current technology for chemical storage batteries, while technically able to provide storage, are expensive for large scale use for the following reasons.
1. The initial capital cost is high per KWh of capacity.
2. Lifetime is short.
3. Depth of discharge is typically in a range of 60-90%, requiring oversized battery bank.
4. Round trip efficiency has significant losses.
5. Exotic materials required for chemical storage may be limited and expensive.
6. Recycling heavy/toxic materials required for chemical batteries is an additional cost at the end of life.
7. Management and/or maintenance of many individual cells adds additional cost.
8. Sensitivity and failure due to over-discharge and over-charge add cost band risk.
9. Aging batteries have reduced depth of discharge over time.

Considerable research and development is still required on many fronts to produce a chemical storage battery which solves the above problems to the degree required for large scale applications.

There are also issues with other known solar energy storage options.

While the storage of electrical energy as heat at high temperature (approx. 500 to 800° C.) is relatively low cost compared to batteries the 'round trip efficiency' (RTE) for electricity-heat-electricity is low. Typically, in the range of 25% to 50%. This has the effect of doubling the total 'system' cost compared to a system with a RTE of 100% with the same heat energy storage capacity. The traditional approach to improving system efficiency is to increase the temperature of the hot source. However, this rapidly increases the complexity and cost and consequently has limited scope.

There is a need for an effective option for storing solar energy to meet customer demand which does not coincide with the time and quantity of incoming solar energy.

The need for an effective solar energy storage option is particularly the case for large scale solar energy plants that produce electricity that contributes to local, regional or national electricity supply networks. Low cost storage can significantly increase the penetration of intermittent renewable energy into the grid while also increasing the effective capacity factor of the grid which conveys the power to the point of use. In effect, low cost storage makes it possible to time shift energy delivery to cut the peaks and fill the troughs of renewable energy supply to fit within the existing grid peak capacity, power quality requirements and energy supply/demand profile.

The above description and the description of the invention described in International publication WO2012/009764 in the name of the applicant in later sections of the specification are not to be taken as an admission of the common general knowledge in Australia or elsewhere.

SUMMARY OF THE INVENTION

The present invention is based on a realization of the applicant that the cost and efficiency of dispatchable power generation in a solar energy plant can be greatly enhanced by:
(a) using thermal energy produced in a solar power generation system of the plant to heat a $1^{st}$ volume of water and 'charge' a hot store in the plant;
(b) using electricity produced in a solar power generation system of the plant to operate a heat engine or other device, such as a refrigeration unit, to extract heat and consequently cool a $2^{nd}$ volume of water, for example to form an ice slurry, and 'charge' a cold store in the plant; and
(c) as desired, transferring energy from the hot store to a heat engine (which may be the same heat engine mentioned in step (b) and transferring energy from the heat engine to the cold store (which acts as a cold sink) to operate the heat engine to produce power in the plant.

The term "heat engine" is understood herein to mean a device that converts heat or thermal energy to mechanical energy, which can then be used to do mechanical work or generate electricity. Typically, a heat engine includes includes an expander for producing shaft power from heat and a generator to convert mechanical work to electrical energy.

The term "heat engine" is understood herein to extend to heat engines that can operate in a reverse mode and use mechanical energy to transfer thermal energy. Typically, when operating as a "reversible heat engine" the heat engine includes a compressor/expander which can use shaft power to transfer heat energy from a low temperature to a higher temperature (heat pumping) or use heat energy transferred from a high temperature to a lower temperature (generating) to produce shaft power in a thermodynamic cycle.

The invention makes it possible to store energy in a hot store and/or a cold store in the solar energy plant during periods of sunlight and to produce power, such as electricity, from the stored energy as required. This is a significant step. Solar-based power plants generate significant quantities of low grade by-product heat (typically over 60% of the incoming solar energy). This is regarded as waste heat because it does not have sufficient temperature to operate heat engines (such as organic Rankine cycle engines known as ORC) efficiently. In other words, most of the thermal energy generated in solar-based plants is low grade heat that is not economically accessible for production of electrical power. In the case of typical 'flat panel' photovoltaic plants the by-product thermal energy (typically 80% of the solar energy captured) is very dilute and cannot be economically utilised and is wasted.

The invention makes it possible to economically capture, store and utilize this low-grade heat such that term 'dispatchable' power may be produced from the storage system during the night or when the sun is not shining. This term 'dispatchable power' has a much higher value than 'Variable power', being typically worth two to ten times more.

By way of further example, the power may be produced during the day to augment the solar output when there are periods of high demand for power.

By way of further example, the electrical power which may be derived for example from a spinning generator attached to the ORC may also be used to stabilize the grid against perturbations caused by loads or other power sources.

In summary, the invention makes it possible to time shift energy delivery to cut the peaks and fill the troughs of renewable energy supply to fit within the existing grid peak capacity, power quality requirements and energy supply/demand profile.

In this context, the invention provides an opportunity to make decisions during periods of sunlight to use electricity produced in the solar power generation system (a) to power a heat engine or other device, such as a refrigeration unit, to extract energy from a cold store and there-by 'charge' a cold sink or (b) as electricity delivered to an electricity power grid or to a customer.

For example, in periods of high availability of electricity from other $3^{rd}$ party sources compared to customer demand during a period of sunlight (or any suitable time), it may be of greater economic value to use the electricity to operate the refrigeration unit and charge a cold sink. Alternatively, if there is low availability of $3^{rd}$ party electricity compared to customer demand during this period of sunlight, it may be of greater economic value to transfer the electricity to the grid.

In general terms, the present invention provides a method of operating a solar energy plant that includes:

(a) converting solar energy into thermal energy and heating a $1^{st}$ volume of water to 'charge' a hot store during an energy storage stage of the method;

(b) converting solar energy into electrical energy and using the electrical energy to operate a heat engine or other device, such as a refrigeration unit, to cool a $2^{nd}$ volume of water, for example to form an ice slurry, and 'charge' a cold store during an energy storage stage of the method; and (c) using the hot store and the cold store to operate a heat engine, such as an organic Rankine cycle engine (ORC), to power an electrical generator or for use in another application, during an energy discharge stage of the method.

Step (c) relies on using heat from the hot store to provide energy to the heat engine via a boiler or evaporator. Step (c) also relies on using the cold store as a cold sink, containing a material such as an ice slurry, to extract heat from the working fluid in the condenser of the heat engine.

The combined effect of the hot store (source) and the cold store (sink) is to contribute positively from a heat transfer perspective and a thermodynamic efficiency perspective to the operation of the heat engine during the energy discharge stage of the method. The operating temperature gradient ($\Delta T$) of the heat engine is the difference of (a) the temperature of the input thermal energy transferred from the hot store (source) to the heat engine and (b) the temperature output of the thermal energy transferred to the cold store (sink) (containing material such as such as an ice slurry) from the heat engine. As the $\Delta T$ increases the efficiency limits of the heat engine increase (a) due to the Carnot efficiency envelope increasing for maximum theoretical performance and (b) due to the practical issues of heat exchange temperature losses in the system becoming a smaller percentage of the total $\Delta T$.

The method may include using a refrigeration unit in step (b) and a separate heat engine in step (c).

The method may include using the heat engine in steps (b) and (c) with the heat engine being a reversible heat engine capable of operating in a forward thermodynamic cycle (expansion/engine) and a reverse thermodynamic cycle (compression/refrigeration) depending on the stage of operation of the method.

The use of the reversible heat engine provides an opportunity to reduce cost.

It is important that the reversible heat engine (and separate units) be highly efficient in both compression and expansion cycles. This process requires more than reversing heat flow as in a reverse cycle heating/cooling unit.

In order to operate at a required efficiency in both cycles, the reversible heat engine may include a control system that selectively controls a valving sequence for flow of the working fluid to and from the heat engine when operating in compression and expansion cycles.

The working fluid of the heat engine may be any suitable fluid.

By way of example, the working fluid may be $CO_2$. The applicant has found that $CO_2$ (or ammonia or any suitable refrigerant) can absorb all the necessary heat in the low temperature range operating range of up to 100° C.

The method may include sourcing the thermal energy transferred to the hot store from coolant used to cool a solar cell receiver illuminated with sunlight.

The method may include recuperating energy from one part of the cycle of steps (a), (b), and (c) to enhance the performance of another part of the cycle.

The method may include recuperating energy from the charging/cooling step (b) to enhance the performance of the engine/expansion step (c).

The method may include recuperating energy from the engine/expansion step (c) to enhance the performance of the charging/cooling step (b).

The solar energy plant may be a large scale solar energy plant for producing electricity from solar energy for use in local, regional or national electricity supply networks.

The term 'large scale solar energy plant' is understood herein to mean a plant that receives at least 600 kW, and more typically at least 1 MW, of solar energy.

The solar power generation system may be any system that converts solar energy directly or indirectly into electricity and thermal energy.

The thermal energy may be waste heat from solar and/or any other source or, may be produced as a deliberate product, for example from a heat pump which can be powered from solar electricity generated by the solar power plant or from the grid.

The use of the heat pump may be synchronized with the use of the refrigeration system such that the output (reject heat) of a chiller of a refrigeration system is used as a source of heat for the heat pump (for example in a cascade configuration), thus avoiding the need for an additional heat exchanger to an external source or sink (typically ambient air or water). Where the chiller and heat pump are complementary in their operation, they may share the same liquid to air heat exchanger at different times. In the case of the chiller it operates as a condenser and the case of the heat pump it operates as an evaporator.

The solar power generation system may be a photovoltaic cell-based system that includes (a) a receiver comprising a plurality of photovoltaic cells that generate electricity from solar radiation that contacts the cells and thermal energy from cooling the cells, with a coolant acting as a thermal energy transfer medium to heat the $1^{st}$ volume of water and (b) a plurality of solar collectors, such as heliostats or dish collectors for receiving and re-directing solar energy onto the photovoltaic cells.

The coolant temperature may be in a range 20 to 250° C. or more.

By way of example, the present invention makes it possible to use low grade solar energy produced in a solar generation system that cannot be used effectively for electricity generation or otherwise in the system. The invention provides an opportunity to use the low-grade heat, unused heat, or low-cost heat as a source of heat in the "heat engine" (such as an organic Rankine engine power generator).

The present invention provides a solar energy plant for producing electricity from solar energy that includes:
(a) a solar power generation system for generating electricity and thermal energy;
(b) a system for transferring thermal energy from the solar power generation system to heat a $1^{st}$ volume of water and 'charging' a hot store;
(c) a heat engine or other suitable device, such as a refrigeration unit, for extracting heat from a $2^{nd}$ volume of water and producing a cold store, such as an ice slurry, during a charging period; and
(d) a heat engine, such as an organic Rankine Cycle power generator, for generating power that is connected to the hot store and the cold store that contribute to the operation of the heat engine to generate power during an energy discharge stage.

The heat engines of items (c) and (d) may (or may not) be the same heat engine operating as a reversible heat engine in reversible expansion/compression cycles. This reversible 'cycle' makes it possible to recuperate heat during charge and discharge cycles and this increases the efficiency, particularly round-trip efficiency (being the efficiency of discharged electricity/charging electricity×100%). The recuperated energy may be stored during the appropriate part of the cycle and released as required to enhance performance in the next cycle.

By way of example, during the charging (chilling) cycle, part of the heat energy 'extracted' from the cold store by the chiller may be stored in an 'intermediate warm store' and used at a later time to preheat the working fluid before it is heated to its working temperature by heat exchange from the (main) hot store. In this manner, the amount of heat required from the hot store to be delivered to the heat engine (such as an ORC) for power production is reduced. This has the effect of increasing the overall efficiency of the cycle.

By way of a further example during the expansion/discharging (power) cycle, the chilling effect of the expansion in the engine can be used to cool water which can be stored in an 'intermediate cool store' and used at a later time to pre-cool the working fluid before it is chilled to its working temperature by the chiller to charge the cold store. In this manner the amount of electricity required to be delivered to the chiller is reduced. This has the effect of further increasing the overall efficiency of the reversible cycle.

When a heat engine (such as an ORC) is operated with typical 'dry cooling', the exhaust heat must be 'heat exchanged' with, and sunk by, ambient air through a large (expensive) liquid-air heat exchanger which also has substantial parasitic power consumption to operate fans to extract the heat. This part of the process also leads to inefficient operation of the heat engine as the air temperature may be high (up to 45° C.) reducing the operation temperature gradient (dT) available to the heat engine.

In addition, when the cold store (sink) contains an ice slurry means, the cold store temperature (by virtue of having a high heat of fusion) remains at a constant low temperature as the ice melts, thereby maintaining a high $\Delta T$ in relation to the hot storage (source). This makes it possible to operate with a comparatively smaller tank than would otherwise be the case. The high heat of fusion in relation to the sensible heat capacity of water means that more energy can be contained per cubic meter of storage which also facilitates reduction of the cold store volume and the attendant cost.

A further benefit of using ice slurry occurs during the heat exchange process with the cold store where the ice melts in the heat exchanger enhancing the thermal conductance thus reducing the $\Delta T$ between the heat transfer fluids and consequently the size and cost of the heat exchanger. This reduced $\Delta T$ also increases the effective temperature gradient available to the heat engine and consequently increases its efficiency of power production.

A further consideration for component sizing and cost minimisation is as follows.

In order to maximise the power output of the heat engine (such as an ORC) it is desirable to have the biggest possible temperature difference between the hot (boiler temperature) and cold (condenser) temperature and over the course of a storage period only a small change in temperatures of the hot and cold storages.

This implies very large hot and cold water storage volumes where the temperature change is small, say 5° C. which add to cost and require high water flow rates which consume pumping power. Furthermore, the power output falls as the storage is discharged as the hot store cools and the cold store warms. On the other hand, in order to minimise the size of the storage volumes and the water flows it is best to have big temperature changes.

For example, the hot water storage might fall from 90° C. to 60° C. Similarly, the cold water store may rise from 2° C. to 32° C. This reduces the storage volume needed by a factor of 6 (compared to a 5C change).

By arranging a cascade of ORC engines, by way of example, to progressively use the heat in the water flow it is possible to maintain a constant power output as the storage discharges and the water storage volumes and flow rates are reduced commensurately.

For example, a four-stage cascade may have engine No. 1 working from 90° C. to 32° C. (a difference of 58° C.), to engine No. 4 which works at 60° C. to 2° C. (still a difference of 58° C.). By this means all of the energy in the water flow is consumed as efficiently as possible and the water storage volumes can be much smaller. Whilst there is more rotating equipment, this arrangement can be lower cost overall as the power output is increased and constant, the water storage volume cost is greatly reduced, and the total heat exchange area needed is the same.

The solar energy plant may be a large scale solar energy plant for producing electricity from solar energy for use in local, regional or national electricity supply networks. The method of electricity generation may include concentrating light to a photovoltaic receiver which directly produces electricity and (by-product) or waste heat.

The solar power generation system may be any suitable system for producing electricity and thermal energy from solar energy.

The solar power generation system may be a photovoltaic cell-based system that includes (a) a receiver comprising a plurality of photovoltaic cells that generate electricity and heat from solar radiation that contacts the cells and (b) a plurality of solar collectors, such as heliostats or dish collectors for receiving and re-directing solar energy onto the photovoltaic cells.

The solar energy plant may include a coolant system for cooling the photovoltaic cells. In effect, in use, the coolant system extracts thermal energy that is produced by solar energy impinging on the solar cell assembly and is unused by the solar cells in generating electricity and thereby maintains the solar cell assembly at optimum operating temperatures.

The coolant system may be in heat exchange relationship with the $1^{st}$ volume of water for transferring thermal energy from a coolant to the water.

The solar energy plant may be a central receiver concentrator photovoltaic plant that includes:
(a) a mirror collector for collecting solar energy and selectively directing collected solar energy, and
(b) a receiver for receiving solar energy from the mirror collector and (i) transferring solar energy for use directly or indirectly as solar energy in the storage system.

The term "mirror collector" is understood herein to cover any device that has a reflective surface that can collect and re-direct solar energy and includes, by way of example, heliostats and Fresnel mirrors. The term "mirror collector" may include arrangements that re-direct and/or concentrate solar energy.

The central receiver concentrator photovoltaic plant may use concentrated sunlight from a field of heliostats to activate an array of high efficiency photovoltaic solar cells mounted on an appropriately-positioned photovoltaic (PV) receiver. Typically, in known plants of this type, 30-35% of the incident light is converted by the solar cells into electricity, 10% of the incident light is reflected off the cell face and is lost, and the remaining 55-60% of the incident light is captured as heat in a working fluid used to cool the solar cells. It can be appreciated that the amount of heat is substantial in the case of large scale solar energy plants that receive at least 600 kW of solar energy.

Possible heat extraction points include the following points.
1. Heat collected by a coolant used to cool photovoltaic cells which are receiving concentrated sunlight (temperature range typically 35-90° C. and possibly up to 250° C.). This energy is captured heat at low temperature (typically less than 250° C., or less than 100° C.) and has been regarded as being of little use unless the solar power plant is close to industry with processes which can use this heat. The need to cool the solar cells means that by-product solar energy is captured as heat in the coolant at a relatively low temperature. The present invention can extract, capture and use this low-grade heat at very low cost and use it beneficially in the plant.
2. Unused parts of the solar spectrum that are not captured by photovoltaic cells may be separated and redirected via suitable selective reflectors or absorbers and optic systems to heat a heat transfer medium (temperature range up to 1000° C.). One example of a selective reflector is a spectrum splitter that redirects longer wavelength energy to a thermal storage unit and allows shorter wavelength energy to pass through the splitter and impinge on solar cells. Examples of optical systems include optical elements which are spectrally selective and have a form by way of example which is Cassegranian, Gregorian or Fresnel. Light guide elements may also be used.
3. Solar energy that is reflected from the cell face.
4. Portions of the concentrated solar energy which make a greater contribution to the value of the total system output by being directed to a thermal receiver (temperature range up to 1000° C.). This energy may be collected by way of example via a separate receiver or a thermal element within the PV receiver.
5. Additional mirror collectors (such as heliostats and dish collectors) for collecting solar energy and selectively directing collected solar energy at receivers to achieve an optimal balance of thermal energy and electrical energy.
6. Secondary mirror collectors (sometimes described as 'flux modifiers') that are added to maximise optical efficiency may also contribute to achieving an optimal balance of thermal energy and electrical energy. Where a receiver has such a 'flux modifier' associated with a receiver for receiving solar energy from the mirror collector or otherwise incident on the secondary mirror collector, the 'flux modifier' tends to run at high temperature, for example as a consequence of absorbing longer wavelength radiation. This absorbed solar energy is a source of heat. The 'flux modifiers' may be formed to increase effective absorption of solar energy without depleting solar energy that is available for photovoltaic solar cells of the receiver.

The solar plant of the present invention may include any one or more of the following features described in detail in International publication WO2012/009764 in the name of the applicant (the whole disclosure of which is incorporated herein by cross-reference):
(a) a photovoltaic receiver and a thermal receiver mounted on one receiver tower in spaced-apart relationship so that the operation of one receiver does not interfere with the operation of the other receiver and vice versa, with each receiver having target areas for receiving solar energy from the mirror collector,
(b) a primary receiver in the form of a photovoltaic cell receiver for receiving solar energy from the mirror collector and a secondary receiver in the form of a thermal receiver for receiving solar energy reflected or re-directed from the primary receiver, and
(c) a photovoltaic cell receiver and a thermal receiver each of which has a separate target area, with the photovoltaic cell receiver and the thermal receiver being positioned so that the separate target areas form part of a single target area for receiving solar energy from the mirror collector and thereby forming a multi-type receiver, and with the receivers being selected on the basis of optimising the operation limits and responsiveness of the receiver to the flux intensity that is incident on respective zones of the single target area.

With regard to item (a) above, the spacing may be selected to be sufficient so that there is no heating or any other unwanted or undesirable influence of one receiver on the other receiver, including components of the receiver such as electrical wiring that causes a loss of performance of the receiver.

With regard to item (c) above, typically, solar energy that is concentrated from a number of collectors, such as heliostats, to a single target area will have a solar flux distribution that has solar flux intensities that increase from the perimeter to the center of the target area. As described in International publication publication WO2012/009764, differences in the responsiveness of different receivers to different flux intensities in such a distribution provides an opportunity to form a single target area that, in effect, has different receiver elements (i.e. different types of sub-receivers) that are optimized for the flux intensities incident on the target area and form, in effect, a multi-type receiver. By way of example, the applicant has recognized that the differences in the operation limits and responsiveness of thermal receivers and photovoltaic cell receivers (and other types of receivers) to flux intensities provides an opportunity to use thermal receivers and photovoltaic receivers in different zones of a single target area, where the zones have different flux intensities. The term 'operation limits and responsiveness' of receivers is understood herein to mean factors that are relevant to operation limits such as energy intensity, variation in energy intensity across a zone of a target area, temperature, current density, thermal conductance, and coolant flow rate and factors that are relevant to responsiveness such as ability to capture energy, receiver cost, conversion efficiency, and the value of energy. By way of example, one factor that may be relevant to a greater of lesser extent in different situations is the responsiveness of receivers to variations in energy intensity across a zone of a target area.

DESCRIPTION OF THE DRAWINGS

The present invention is described further by way of example with reference to the accompanying drawings, of which.

DESCRIPTION OF EMBODIMENT OF THE INVENTION

The embodiment of the solar energy plant in accordance with the invention shown in the Figures is a combination of (a) a central receiver concentrator photovoltaic plant and (b) an energy storage and conversion system.

The output of the solar energy plant is dispatchable electricity to an electricity grid or load 'on demand'. The electricity is dispatchable at any time including during periods of sunlight or no sunlight.

Figure 1:
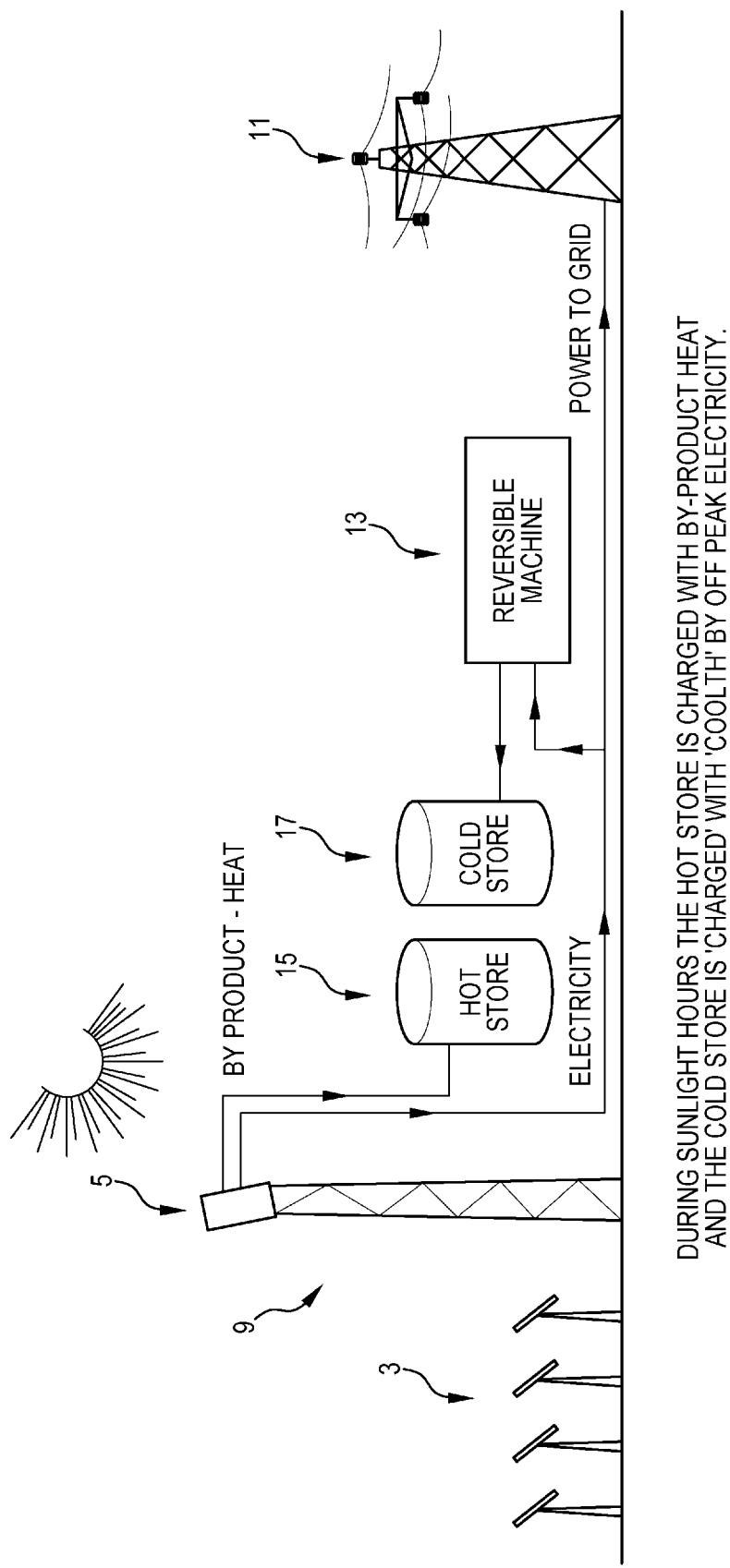
FIG. 1 is a diagram that illustrates an embodiment of a solar energy plant in accordance with the invention during an energy storage ("charging") stage of the operation of the plant.
Figure 2:
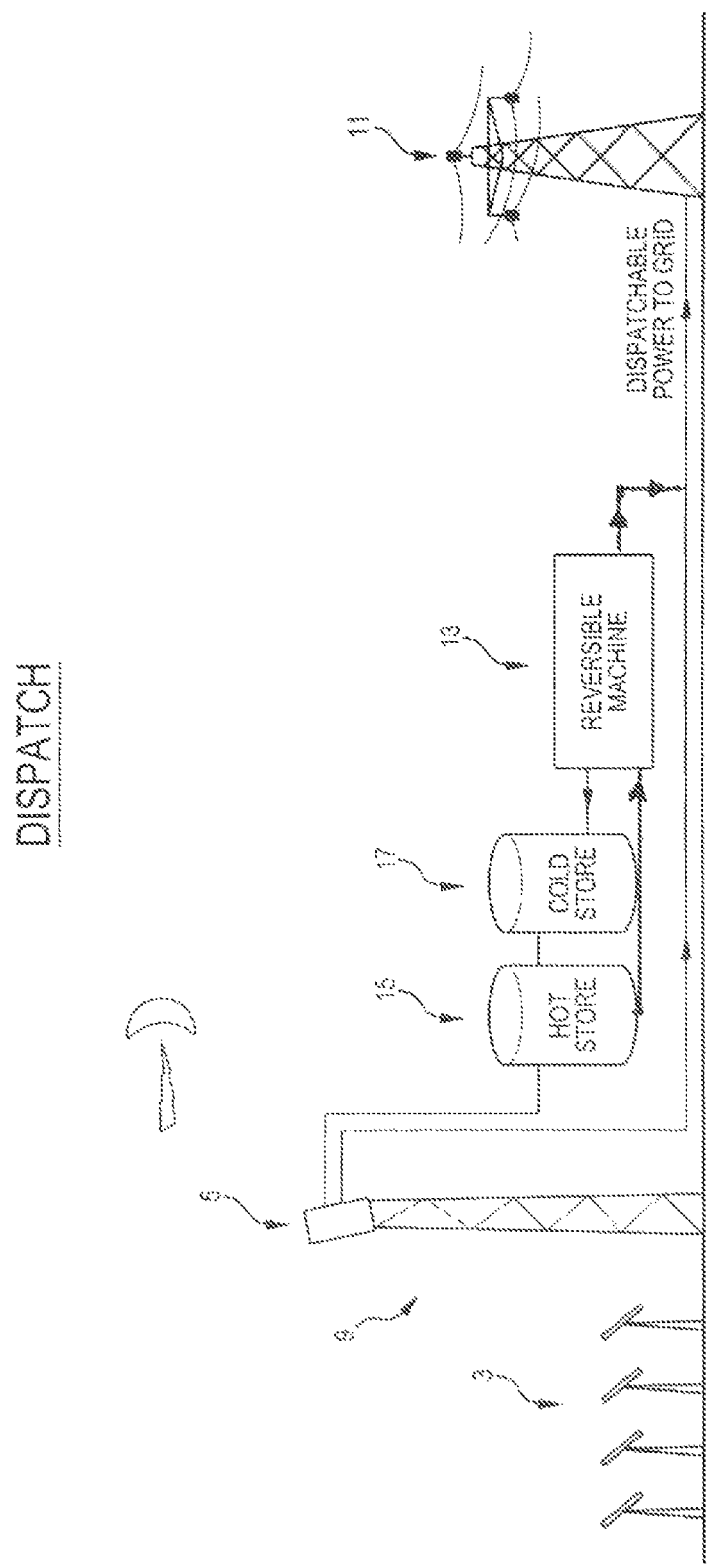
FIG. 2 is a diagram that illustrates an embodiment of a solar energy plant in accordance with the invention during an energy discharge stage of the operation of the plant.
Figure 8:
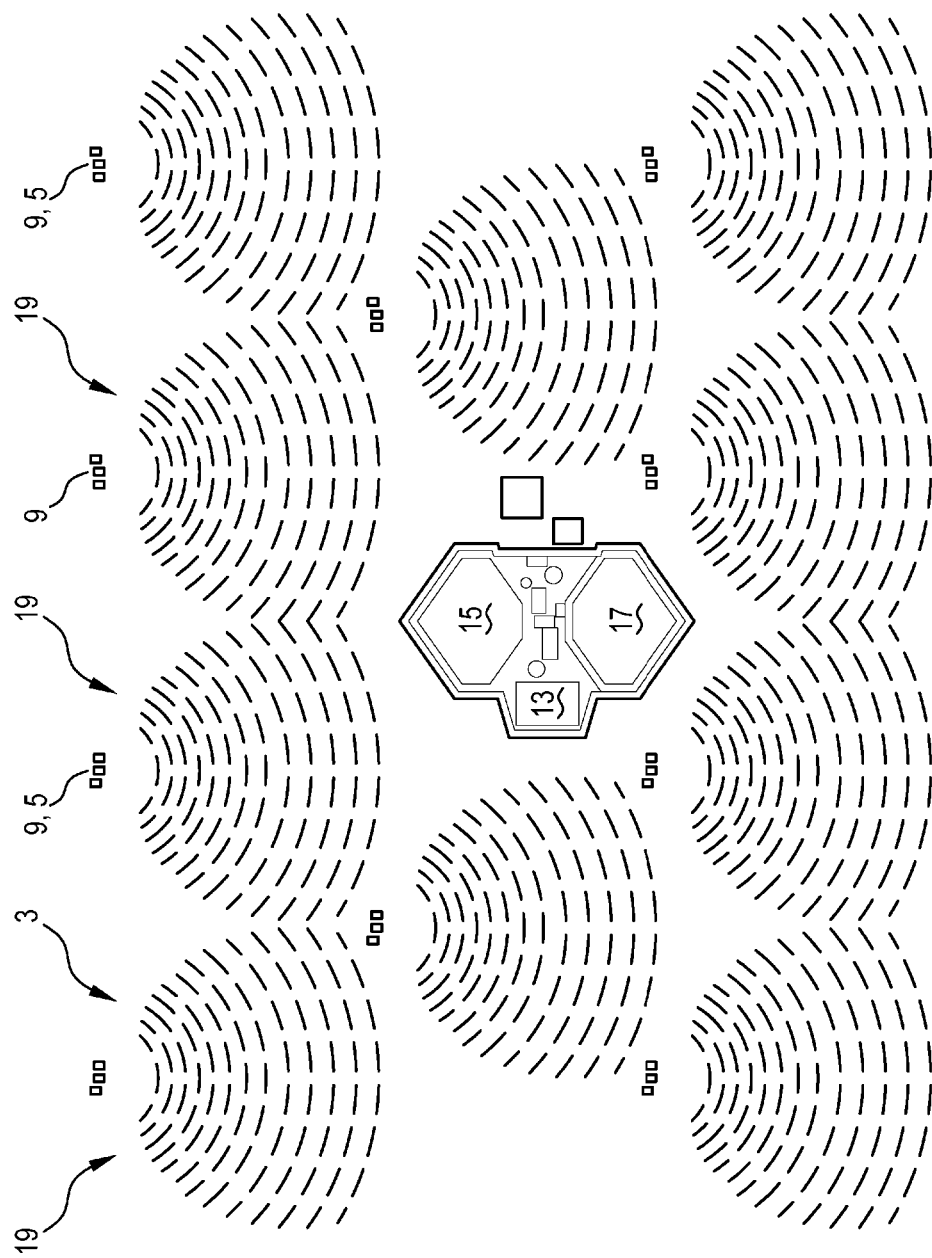
FIG. 8 is a plan view that illustrates the embodiment of the solar energy plant in accordance with the invention shown in FIGS. 1 and 2.

The central receiver concentrator photovoltaic plant of the solar energy plant shown in FIGS. 1, 2 and 8 is as described in the above-mentioned International publication WO2012/009764, with the disclosure incorporated herein by cross-reference. The central receiver concentrator photovoltaic plant includes a plurality of mirror collectors in the form of heliostats 3 that are arranged in an array 19 on a given area. FIG. 8 illustrates a plurality of arrays 19. The array may be any suitable array. Each collector 3 is arranged so that the orientation of the collector 3 can be changed to track the movement of the Sun and to reflect and to concentrate solar energy that contacts the collectors 3. The Sun tracking system may be any suitable system. The central receiver concentrator photovoltaic plant also includes a tower 9 and a solar energy receiver 5 in the form of a photovoltaic receiver located on the tower 9. The receiver 5 is arranged to receive solar energy from the collectors 3. The receiver 5 is not illustrated in detail in the Figure other than in a very diagrammatic form. The receiver 5 includes an array of photovoltaic solar cells for converting solar energy into electrical energy. The electrical energy is transferred via an electrical circuit for use as described further below. The receiver 5 also includes a heat extraction system, with a coolant circuit, to maintain the temperature of the receiver at an efficient operating temperature.

The energy storage and conversion system of the solar energy plant shown in FIGS. 1 and 2 includes a tank 15 for storing a volume of hot water (hereinafter referred to as hot store 15), a tank 17 for storing a volume of cold water (hereinafter referred to as cold store 17), and a reversible heat engine 13. It is noted that, whilst the Figures show separate tanks 15, 17, the invention is not limited to this arrangement.

The hot store 15 contains a $1^{st}$ volume of water. The cold store 17 contains a $2^{nd}$ volume of water. In use of the solar plant, in a charging mode (FIG. 1) and in a discharging mode (dispatch-FIG. 2), the hot store 15 and the cold store 17 operate as sources of heat or heat sinks depending on the mode of operation.

The hot store 15 and the cold store 17 are each connected to the reversible heat engine 13, which may be any suitable form of reversible heat engine, such as a reversible organic Rankine engine.

As can best be seen in FIG. 1, the hot store 15 is connected to the central receiver concentrator photovoltaic plant, for example to a coolant circuit of the receiver 5, of the plant, to receive waste heat from the plant during the charging mode of the solar energy plant shown in FIG. 1.

With further reference to FIG. 1, the heat engine or 'reversible machine' (when used in a chiller mode to charge cold store 17) is electrically connected to the central receiver concentrator photovoltaic plant and can be powered by electricity from the plant to cause water in the cold store 17 to be cooled, for example to an ice slurry, during the charging mode of the solar energy plant shown in FIG. 1.

In general terms, one embodiment of the method of operating the solar energy plant shown in FIGS. 1 and 2 includes:
  (a) converting solar energy into thermal energy and heating the $1^{st}$ volume of water in the charging mode of the solar energy plant shown in FIG. 1;
  (b) converting solar energy into electrical energy and using the electrical energy to operate the heat engine 13 to cool the 2$^{nd}$ volume of water and 'charge' the cold store 17 in the charging mode of the solar energy plant shown in FIG. 1; and (c) using the hot store 15 and the cold store 17 to operate the heat engine 13 to power an electrical generator connected to the heat engine during the energy discharge (dispatch) mode of the solar energy plant shown in FIG. 2.

Step (c) relies on using heat from the hot store 15 to provide energy to the heat engine 13. Step (c) also relies on using the cold store 17 as a cold sink, containing a material such as an ice slurry, to extract heat from a working fluid of the heat engine 13.

As described in detail above, the combined effect of the hot store 15 (source) and the cold store 17 (sink) is to contribute positively from a heat transfer perspective and a thermodynamic efficiency perspective to the operation of the heat engine 13 during the energy discharge (dispatch) mode of the method in that the operating ΔT of the heat engine 13 is the difference of (a) the temperature of the input thermal energy transferred from the hot store 15 (source) to the heat engine 13 and (b) the temperature output of the thermal energy transferred to the cold store 17 (containing material such as such as an ice slurry) from the heat engine 13.

Further embodiments of the invention, including embodiments shown in FIGS. 3-7 include a 'recuperation' unit to enhance the round trip efficiency (RTE) by:

a) use of an additional heat pump to increase the system capacity by delivering more heat to the hot store 15 by using electrical power from the solar receiver or the grid;

b) use of cascade arrangements to further enhance the system efficiency and/or reduce storage size; and c) the addition of transparent insulation to the hot store to capture direct solar energy.

Figure 3:
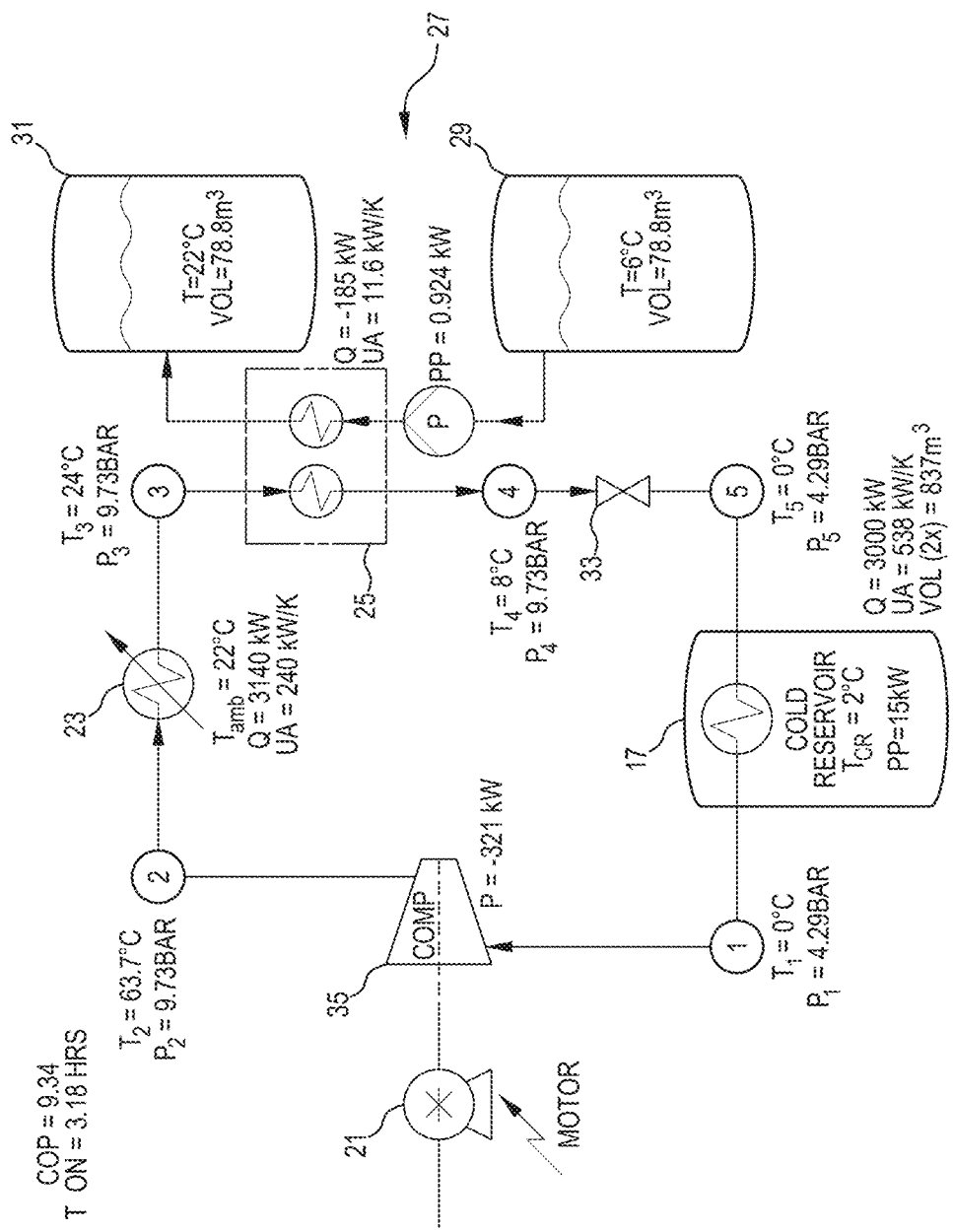
FIG. 3 is a diagram of an embodiment of a single charging stage unit of the plant.
Figure 4:
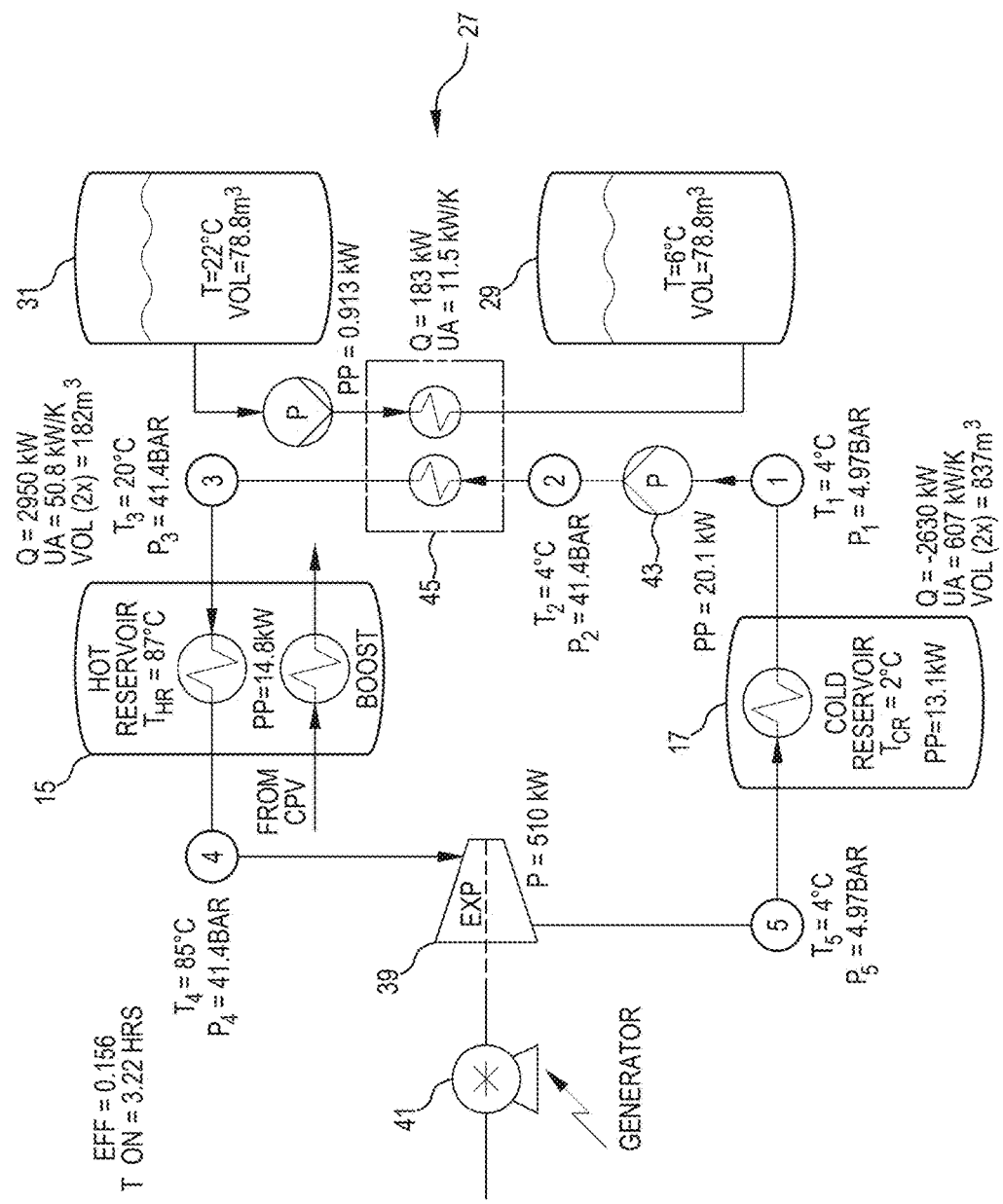
FIG. 4 is a diagram of an embodiment of a single energy discharge stage unit of the plant.

FIG. 3 is a diagram of an embodiment of a single charging stage unit of the plant. FIG. 4 is a diagram of an embodiment of a single energy discharge stage unit of the plant. These units are adapted to operate together.

With reference to FIG. 3, a motor 21 compresses a working fluid of the heat engine 13 that is in a gas form in a compressor 35 to a temperature T of 63.7° C. and pressure P of 9.73 bar. The compressed gas flows through a condenser 23 and heat is extracted and exhausted to atmosphere. The resultant warm liquid from the condenser 23 is at T=24° C., with the pressure remaining at P=9.73 bar.

The warm liquid flows through a heat exchanger 25 and is cooled by heat exchange with a recuperator unit generally identified by the numeral 27 to a temperature T=8° C., with the pressure remaining at P=9.73 bar.

The recuperator unit 27 includes 2 separate tanks 29, 31. Tank 29 contains a volume of cold water and tank 31 contains a volume of hot water. The temperatures of the tanks 29, 31 under typical operating conditions are shown in the Figure. The tanks 29, 31 are interconnected, and water flows from tank 29 to tank 31 in this embodiment. The water flows through the heat exchanger 25 and is heated via heat exchange with the warm liquid from the condenser 23.

The effect of the recuperator 27 is to remove heat from the working fluid cycle, with the heat being stored for use at a later time.

The cooled warm liquid from the heat exchanger 25 flows through an expansion valve 33 and forms a gas/liquid mixture of working fluid at a temperature of T=0° C. and a pressure P=4.29 bar. In other words, some of the cooled warmed liquid is flashed to gas and the remainder remains as cooled liquid.

The gas/liquid working fluid mixture exiting the expansion valve 33 flows through a cold store 17. The cold store 17 contains cool water. The cool water in the cold store 17 transfers heat to the liquid working fluid and boils the liquid working fluid. The heat transfer from the cool water results in the cool water in the cold store 17 being cooled further.

All of the liquid working fluid is converted to gas, and the gas leaves the cold store at a temperature of T=0° C. and a pressure P=4.29 bar and flows back to the compressor 35 to repeat the above-described cycle.

The circuit shown in FIG. 4 transfers heat to the cold store 17. The circuit shown in FIG. 4 generates electricity from waste heat from thermal energy produced in a solar plant.

With reference to FIG. 4, thermal energy in the form of heated coolant of a PV array or any other source of thermal energy in a solar plant-see numeral 37 in FIG. 4—flows through the hot store 15 and heats water in the hot store 15 by indirect heat exchange. The coolant is returned to the PV array, reheated and returned to the hot store 15.

A working fluid in the form of a liquid at a temperature of T=20° C. and a pressure P=41.4 bar also flows through the hot store 15 and is heated by indirect heat transfer from the water in the hot store 15 to a temperature of T=85° C., while remaining at a pressure P=41.4 bar and forms a gas.

The gas from the hot store 15 flows to an expander 39, in which the gas pressure and temperature drop and the volume of gas expands significantly and the resultant energy released as a consequence of these changes drives an electrical generator 41.

The gas exiting the expander 39 is at a temperature of T=4° C. and a pressure P=4.97 bar. The gas flows through the cold store 17 and is condensed to a liquid working fluid via indirect heat exchange with cold water in the cold store 17 and heats the cold water in the cold store 17.

The liquid working fluid exiting from heat exchange with the cold store 17 is at a temperature of T=4° C. and a pressure P=4.97 bar.

The liquid is pumped by a pump 43 to a heat exchange unit 25. The liquid exiting the pump 43 is at a temperature of T=4° C. and a significantly higher pressure P=41.4 bar compared to the pump inlet pressure.

The heat exchange unit 25 heats the liquid to a temperature of T=20° C., while the pressure remains at P=41.4 bar. This heated liquid working fluid then flows into the hot store 15, as described above, to repeat the above-described cycle.

The liquid working fluid flowing through the heat exchanger 25 is heated via indirect heat exchange with a recuperator unit generally identified by the numeral 27. This is the same recuperator unit as described in relation to FIG. 3 but operating in a different mode.

The recuperator unit 27 includes 2 separate tanks 29, 31. Tank 29 contains a volume of cold water and tank 31 contains a volume of hot water. The temperatures of the tanks 29, 31 under typical operating conditions are shown in the Figure. The tanks 29, 31 are interconnected, and hot water flows from tank 31 to tank 29 in this embodiment. The water flow heats the working fluid flowing counter-current and the heat transfer cools the recuperator water.

It can be appreciated from FIGS. 3 and 4 and the above description that the recuperators 27 act in a complementary way in that there is heat transfer to the recuperators in one mode of operation and heat transfer from the recuperators in another mode of operation.

Figure 5:
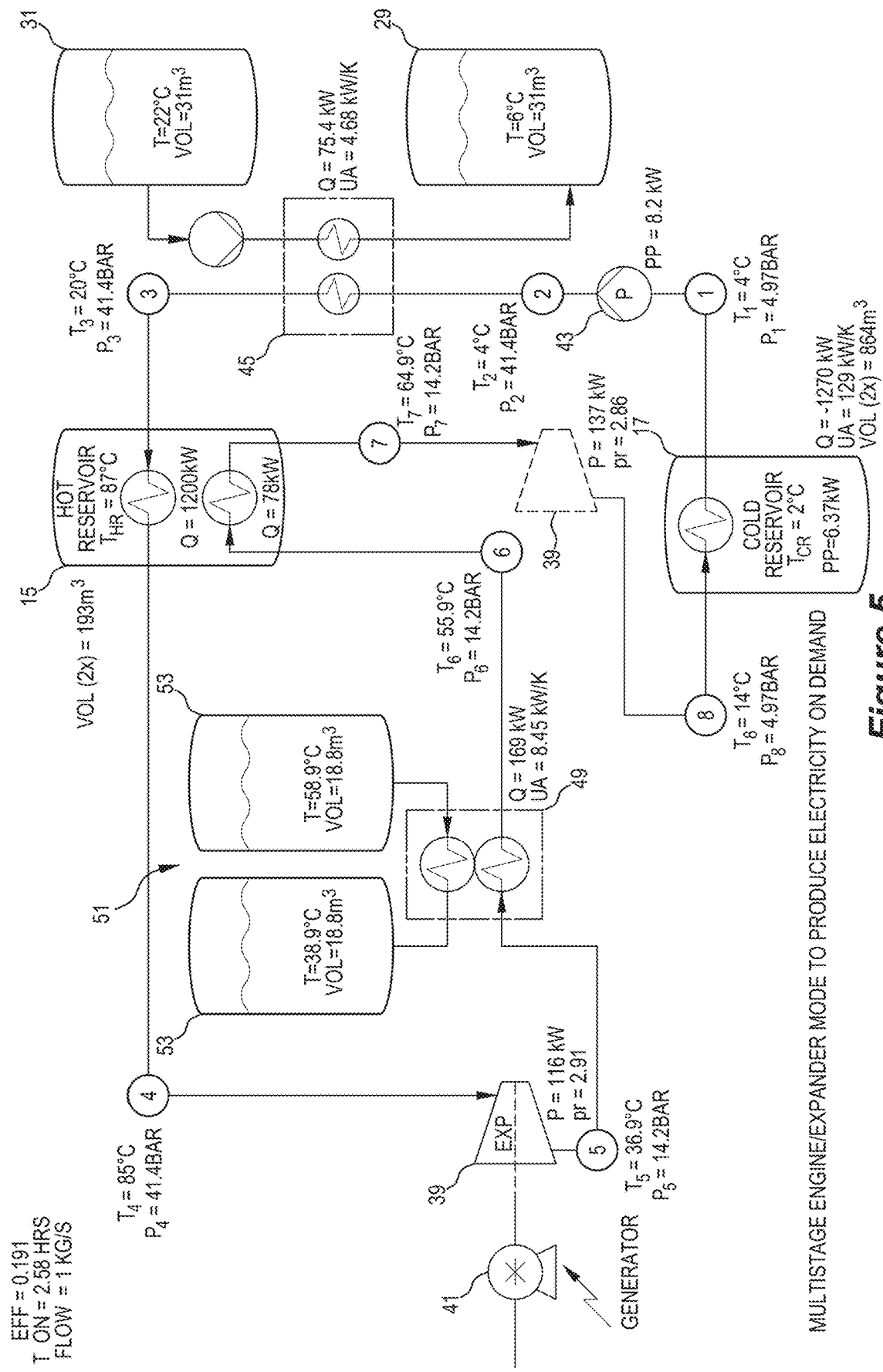
FIG. 5 is a diagram of an embodiment of a multiple energy discharge stage unit of the plant.
Figure 6:
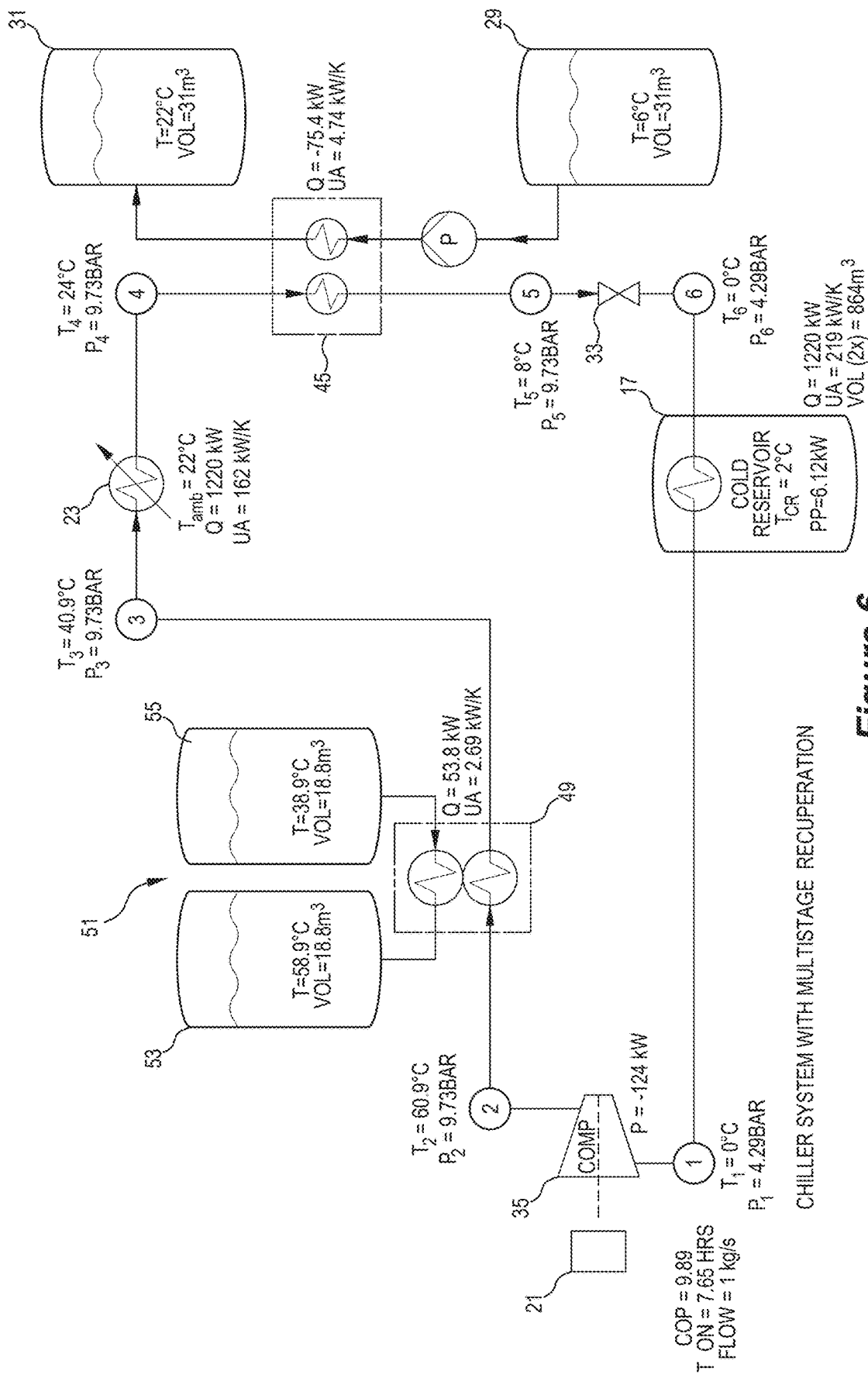
FIG. 6 is a diagram of an embodiment of a chiller unit of the plant with multiple stage recuperation.

FIG. 5 is a diagram of an embodiment of a multiple energy discharge stage unit of the plant. FIG. 6 is a diagram of an embodiment of a chiller unit of the plant with multiple stage recuperation. These units are adapted to operate together. The same reference numerals used in FIGS. 3 and 4 are used in FIGS. 5 and 6 to describe the same features. These Figures also include a second recuperator generally identified by the numeral 51 and including two tanks 53, 55 in heat transfer relationship with heat exchangers 49. The operation of the circuits in FIGS. 5 and 6 is fundamentally the same as the circuits in FIGS. 3 and 4. The difference between the two sets of Figures is that FIGS. 5 and 6 operate on a multiple stage basis.

Figure 7A:
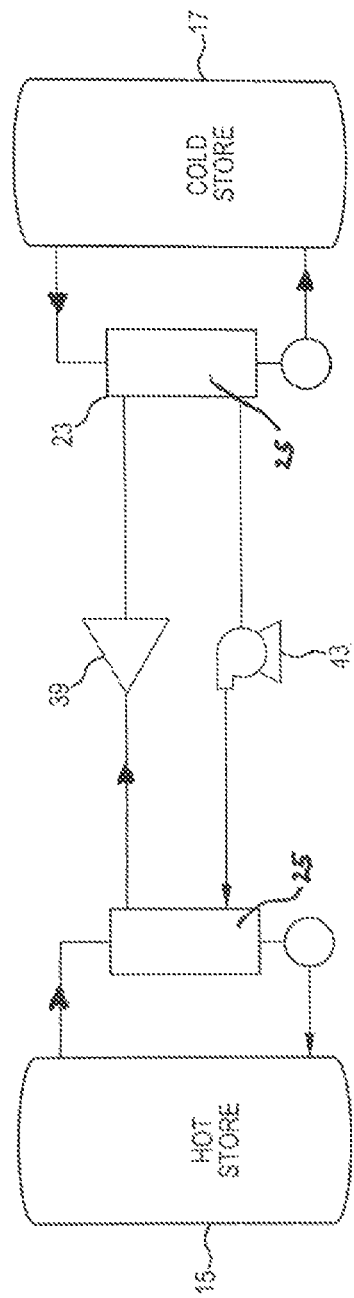
FIG. 7a is a diagram of a single charging and energy discharge unit and FIG. 7b is a diagram that illustrates four of these units in a cascade system.
Figure 7B:
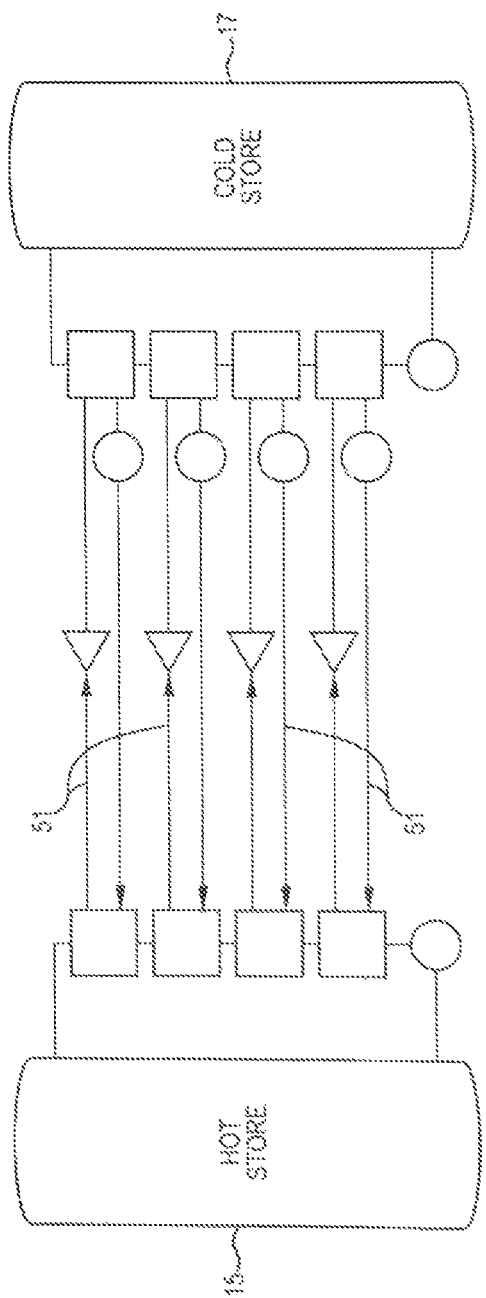

FIG. 7a is a diagram of a single charging and energy discharge unit 61 and FIG. 7b is a diagram that illustrates four of these units 61 in a cascade system. The single charging and energy discharge unit 61 comprises the above-described hot store 15, cold store 17, expander 39, pump 43, condenser 23, and heat exchangers 25. The cascade of units 61 progressively use the heat in the water flow to produce a constant power output as the storage discharges and the water storage volumes and flow rates are reduced commensurately. For example, a four-stage cascade may have heat engine No. 1 working from 90° C. to 32° C. (a difference of 58° C.) to heat engine No. 4 which works at 60° C. to 2° C. (still a difference of 58° C.). By this means all of the energy in the water flow is consumed as efficiently as possible and the water storage volumes in the hot store 15 and the cold store 17 can be much smaller. Whilst there is more rotating equipment, this arrangement can be lower cost overall as the power output is increased and constant, the water storage volume cost is greatly reduced, and the total heat exchange area needed is the same Many modifications may be made to the present invention described above without departing from the spirit and scope of the invention.

By way of example, the invention is not confined to the particular central receiver concentrator photovoltaic plant shown in the Figures.

In addition, whilst not described, the receivers shown in the Figures may comprise an optical element, such as a mirror, that is associated with a receiver that absorbs some solar energy at high temperature and directs the remainder of the solar energy that is incident on the element onto the target area of the receiver or onto the target area of another receiver.

The invention claimed is:

1. A method of operating a large scale solar energy plant that converts solar energy into electrical energy and thermal energy, the method including:
   (a) converting solar energy into thermal energy and heating a first volume of water to charge a hot store during an energy storage stage of the method, with the step including sourcing thermal energy from a coolant used to cool a solar cell receiver of the solar energy plant when the solar cell receiver is illuminated with sunlight;
   (b) converting solar energy into electrical energy and using the electrical energy to operate a first heat engine to cool a second volume of water and charge a cold store via heat exchange with a working fluid of the first heat engine that is in heat exchange relationship with the cold store during the energy storage stage of the method, with the first heat engine extracting heat from the second volume of water and exhausting heat to atmosphere;
   (c) using the hot store and the cold store to operate the first heat engine or a second heat engine to power an electrical generator during an energy discharge stage of the method, wherein step (c) includes:
      (i) using the hot store to transfer heat to the working fluid of at least one of the first heat engine or the second heat engine,
      (ii) transferring thermal energy from the working fluid and generating power in at least two power generation stages, and,
      (iii) using the cold store as a cold sink to extract heat from the working fluid;
   (d) recuperating heat energy from the working fluid in step (b) in at least two stages; and,
   (e) transferring recuperated heat energy to the working fluid in step (b) in at least two stages via a first recuperator and a second recuperator to enhance the performance of step (c), wherein the at least two stages include:
      (i) a first stage which comprises transferring heat to the working fluid via the first recuperator before the hot store transfers heat to the working fluid, and
      (ii) a second stage which comprises transferring heat to the working fluid, via the second recuperator and then the hot store, after thermal energy has been transferred from the working fluid to generate power in one power generation stage and before transferring thermal energy from the working fluid and generating power in a second power generation stage.

2. The method defined in claim 1 wherein the combined effect of the hot store and the cold store is to contribute positively from a heat transfer perspective and a thermodynamic efficiency perspective to the operation of the first heat engine or the second heat engine during the energy discharge stage of the method.

3. The method defined in claim 1 further comprising using a refrigeration unit as the first heat engine in step (b) and a separate heat engine as the second heat engine in step (c).

4. The method defined in claim 1 further comprising using a heat pump as the first heat engine to generate heat.

5. The method defined in claim 4 comprising using the heat pump in cascade with a chiller to generate heat.

6. The method defined in claim 5 further comprising using the heat pump to generate heat, with the heat pump being run in a complementary manner to the chiller such that they share the same liquid to air heat exchanger.

7. The method defined in claim 1 further comprising adding heat to the hot store from external sources.

8. The method defined in claim 1 further comprising adding heat to the hot store from direct solar irradiance of the hot store through transparent insulation.

9. The method defined in claim 1 further comprising adding heat to the hot store by de-tuning an operational load set point of the solar cell receiver to produce less electrical power and more heat.

10. The method defined in claim 1 further comprising using the same heat engine in steps (b) and (c) with the heat engine being a reversible heat engine capable of operating in a forward thermodynamic cycle and a reverse thermodynamic cycle depending on the stage of operation of the method.

11. The method defined in claim 10 wherein, in order to operate at a required efficiency in both cycles, the reversible heat engine includes a control system that selectively controls a valving sequence for flow of the working fluid to and from the reversible heat engine when operating in the forward thermodynamic cycle and the reverse thermodynamic cycle.

12. The method defined in claim 1 further comprising using $CO_2$ or ammonia as the working fluid for the first heat engine or as the working fluid for the second heat engine to absorb heat in a low temperature operating range of up to 100° C.

13. A large scale solar energy plant for producing electricity from solar energy that includes:
   (a) a solar power generation system for generating electricity and thermal energy;
   (b) a system for transferring thermal energy from the solar power generation system to heat a first volume of water and to charge a hot store;
   (c) a first heat engine for extracting heat from a second volume of water to charge a cold store during a charging period, with the first heat engine being configured to extract heat from the second volume of water and exhaust heat to atmosphere;
   (d) the first heat engine or a second heat engine connected to the hot store and the cold store for generating power during an energy discharge stage via at least two expanders; and,
   (e) at least two recuperators for recuperating heat energy from the first heat engine or the second heat engine and for transferring recuperated heat energy to the working fluid of the first heat engine or the second heat engine in at least two stages, with the at least two recuperators including:
      (i) a first recuperator for transferring heat to the working fluid before the hot store transfers heat to the working fluid, and
      (ii) a second recuperator for transferring heat to the working fluid after thermal energy has been transferred from the working fluid to generate power in a first expander of the at least two expanders and before transferring thermal energy from the working fluid and generating power in a second expander of the at least two expanders, wherein the hot store transfers heat to the working fluid after the second recuperator and before transferring thermal energy from the working fluid and generating power in the second expander.

14. The plant defined in claim 13 wherein the first heat engine and the second heat engine are the same heat engine configured to operate as a reversible heat engine in reversible expansion/compression cycles.

15. The plant defined in claim 13 wherein the solar power generation system includes a photovoltaic cell-based system that includes (a) a solar cell receiver comprising a plurality of photovoltaic cells that generate electricity and heat from solar radiation that contacts the cells and (b) a plurality of solar collectors for receiving and re-directing solar energy onto the photovoltaic cells.

* * * * *